US008169395B2

(12) United States Patent
Jo et al.

(10) Patent No.: US 8,169,395 B2
(45) Date of Patent: May 1, 2012

(54) APPARATUS AND METHOD OF DRIVING LIQUID CRYSTAL DISPLAY DEVICE

(75) Inventors: Sung Hak Jo, Anyang si (KR); Binn Kim, Seoul (KR); Nam Wook Cho, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 1029 days.

(21) Appl. No.: 11/819,315

(22) Filed: Jun. 26, 2007

(65) Prior Publication Data

US 2008/0122774 A1 May 29, 2008

(30) Foreign Application Priority Data

Jun. 26, 2006 (KR) ........................ 10-2006-0057262

(51) Int. Cl.
*G09G 3/36* (2006.01)

(52) U.S. Cl. ............ 345/99; 345/98; 345/100; 345/213; 345/204

(58) Field of Classification Search ............ 345/87–104, 345/204–215, 690–699
See application file for complete search history.

(56) References Cited

U.S. PATENT DOCUMENTS

| 6,426,743 | B1 * | 7/2002 | Yeo et al. ........................ 345/213 |
| 6,556,646 | B1 * | 4/2003 | Yeo et al. ........................ 377/54 |
| 2002/0044625 | A1 * | 4/2002 | Kim et al. ........................ 377/54 |
| 2003/0128180 | A1 * | 7/2003 | Kim et al. ........................ 345/100 |
| 2003/0227433 | A1 * | 12/2003 | Moon ........................ 345/100 |
| 2004/0109526 | A1 * | 6/2004 | Park et al. ........................ 377/64 |
| 2004/0150610 | A1 * | 8/2004 | Zebedee et al. ........................ 345/100 |
| 2004/0217935 | A1 * | 11/2004 | Jeon et al. ........................ 345/100 |
| 2004/0239608 | A1 * | 12/2004 | Chung ........................ 345/100 |
| 2005/0104836 | A1 * | 5/2005 | Lin et al. ........................ 345/98 |
| 2005/0134545 | A1 * | 6/2005 | Jang et al. ........................ 345/100 |
| 2006/0238482 | A1 * | 10/2006 | Jang et al. ........................ 345/100 |

* cited by examiner

*Primary Examiner* — Lun-Yi Lao
*Assistant Examiner* — Gene W Lee
(74) *Attorney, Agent, or Firm* — McKenna Long & Aldridge, LLP

(57) ABSTRACT

An apparatus and method of driving an LCD device is disclosed, which has a simplified structure by decreasing the number of signal transmission lines included in a shift register, the apparatus comprising a display panel to display images; a gate driver to drive gate lines of the display panel; a timing controller to control the gate driver by generating at least three clock pulses having the different phases from one another; and a start pulse generator to generate a start pulse using at least two clock pulses among at least three clock pulses, and to supply the generated start pulse to the gate driver.

7 Claims, 8 Drawing Sheets

APPARATUS AND METHOD OF DRIVING LIQUID CRYSTAL DISPLAY DEVICE

This application claims the benefit of Korean Patent Application No. 2006-57262 filed on Jun. 26, 2006, which is hereby incorporated by reference as if fully set forth herein.

BACKGROUND OF THE INVENTION

1. Field of the Invention

The present invention relates to an apparatus and method of driving a liquid crystal display (LCD) device, which has a simplified structure by decreasing the number of signal transmission lines providing signals to a shift register.

2. Discussion of the Related Art

Generally, a liquid crystal display (LCD) device displays images under the control of light transmittance in liquid crystal. The LCD device is comprised of an LCD panel which includes a plurality of pixel regions arranged in a matrix configuration; and a driving circuit which drives the LCD panel.

The LCD panel includes a plurality of gate and data lines being orthogonal to each other, and a plurality of pixel regions defined by the gate and data lines being orthogonal to each other. To apply an electric field to each pixel region, there are pixel electrodes and a common electrode. Each of the pixel electrodes is electrically connected to a thin film transistor (TFT) which functions as a switching element. The thin film transistor (TFT) is turned-on by a scan pulse of the gate line, whereby the pixel electrode is charged with a data signal of the data line.

The driving circuit includes a gate driver to drive the gate lines; a data driver to drive the data lines; a timing controller to supply control signals to the gate and data drivers; and a power source to supply power source signals to the LCD panel, the gate and data drivers, and the timing controller.

The gate driver includes a shift register to output scan pulses in sequence. The shift register is comprised of a plurality of stages cascaded with one another, wherein the plurality of stages sequentially output the scan pulses to scan the gate lines of LCD panel. A first stage among the plurality of stages is supplied with a start pulse from the timing controller and the others stages are supplied with a start pulse, an output signal outputted from the preceding stage. And the plurality of stages are supplied with at least one of a plurality of clock pulses having the sequential phase differences. The plurality of stages output the scan pulses to the gate lines of LCD panel in sequence. Accordingly, the gate driver needs a plurality of signal lines to supply the start pulse and the plurality of clock pulses.

However, if the shift register is formed in and is integrated with a thin film transistor (TFT) array substrate of the LCD panel, the TFT array substrate includes the plurality of signal lines to supply the start pulse and the plurality of clock pulses from the timing controller to the shift register.

A start pulse line is formed on the TFT array substrate, wherein the start pulse line is formed of the same metal material as the gate or data line. Also, the start pulse line is connected to the first stage and the dummy stage among the plurality of stages included in the shift register. Thus, the shift register is increased in size so that the shift register occupies the large space of TFT array substrate.

If providing at least one dummy stage to reset the last stage among the plurality of stages which generate the plurality of scan pulses in sequence, the size of shift register is increased more.

SUMMARY OF THE INVENTION

Accordingly, the present invention is directed to an apparatus and method of driving an LCD device that substantially obviates one or more problems due to limitations and disadvantages of the related art.

An object of the present invention is to provide an apparatus and method of driving an LCD device which has a simplified structure by decreasing the number of signal transmission lines included in a shift register.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus of driving an LCD device comprises a display panel to display images; a gate driver to drive gate lines of the display panel; a timing controller to control the gate driver by generating at least three clock pulses having the different phases from one another; and a start pulse generator to generate a start pulse using at least two clock pulses among at least three clock pulses, and to supply the generated start pulse to the gate driver.

In another aspect, an apparatus of driving an LCD device comprises an LCD panel to display images; a gate driver to drive gate lines of the LCD panel; a timing controller to control the gate driver by generating at least three clock pulses having the different phases; and a reset signal generator to generate a reset signal using at least two of the clock pulses, and to supply the generated reset signal to the gate driver.

In another aspect, a method of driving an LCD device comprises generating at least three clock pulses having the different phases; and generating a start pulse using at least two of the clock pulses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an apparatus and method of driving an LCD device according to the present invention will be described with reference to the accompanying drawings.

Figure 1:
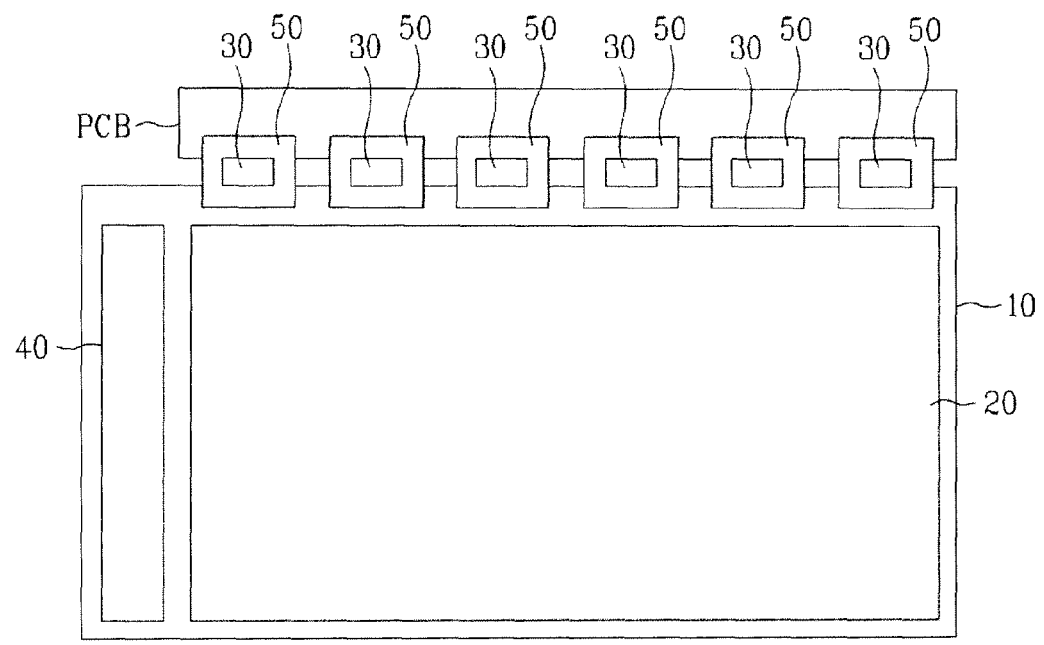
FIG. 1 is a schematic view of illustrating an LCD device according to the preferred embodiment of the present invention.

FIG. 1 is a schematic view of illustrating an LCD device according to the preferred embodiment of the present invention.

As shown in FIG. 1, the LCD device according to the preferred embodiment of the present invention is comprised of an LCD panel 20 which includes a plurality of gate and data lines formed on a TFT array substrate 10; a plurality of circuit films 50 which include a plurality of data drivers 30 to drive the plurality of data lines, wherein the plurality of data drivers 30 are respectively mounted on the circuit films 50; and a gate driver 40 which drives the plurality of gate lines.

The LCD panel 20 includes a thin film transistor (TFT) which is formed in each of pixel regions defined by the plurality of gate and data lines; and a pixel electrode which drives liquid crystal molecules. The thin film transistor (TFT) supplies a data signal of the data line to the pixel electrode in response to a scan pulse of the gate line.

Each data driver 30 is mounted on the circuit film 50 whereby the data driver 30 is connected between the LCD panel 20 and a PCB. The data driver 30 converts digital video data provided from a timing controller into analog video data; and supplies the analog video data for one horizontal line to the data lines every horizontal period. That is, the data driver 30 selects a gamma voltage having a predetermined level based on a gray scale value of analog video data; and supplies the selected gamma voltage to the data line.

The gate driver 40 includes a shift register which sequentially generates scan pulses. In response to the scan pulse, the thin film transistor (TFT) is turned-on. Also, the shift register is formed in and is integrated with the TFT array substrate 10.

Figure 2:
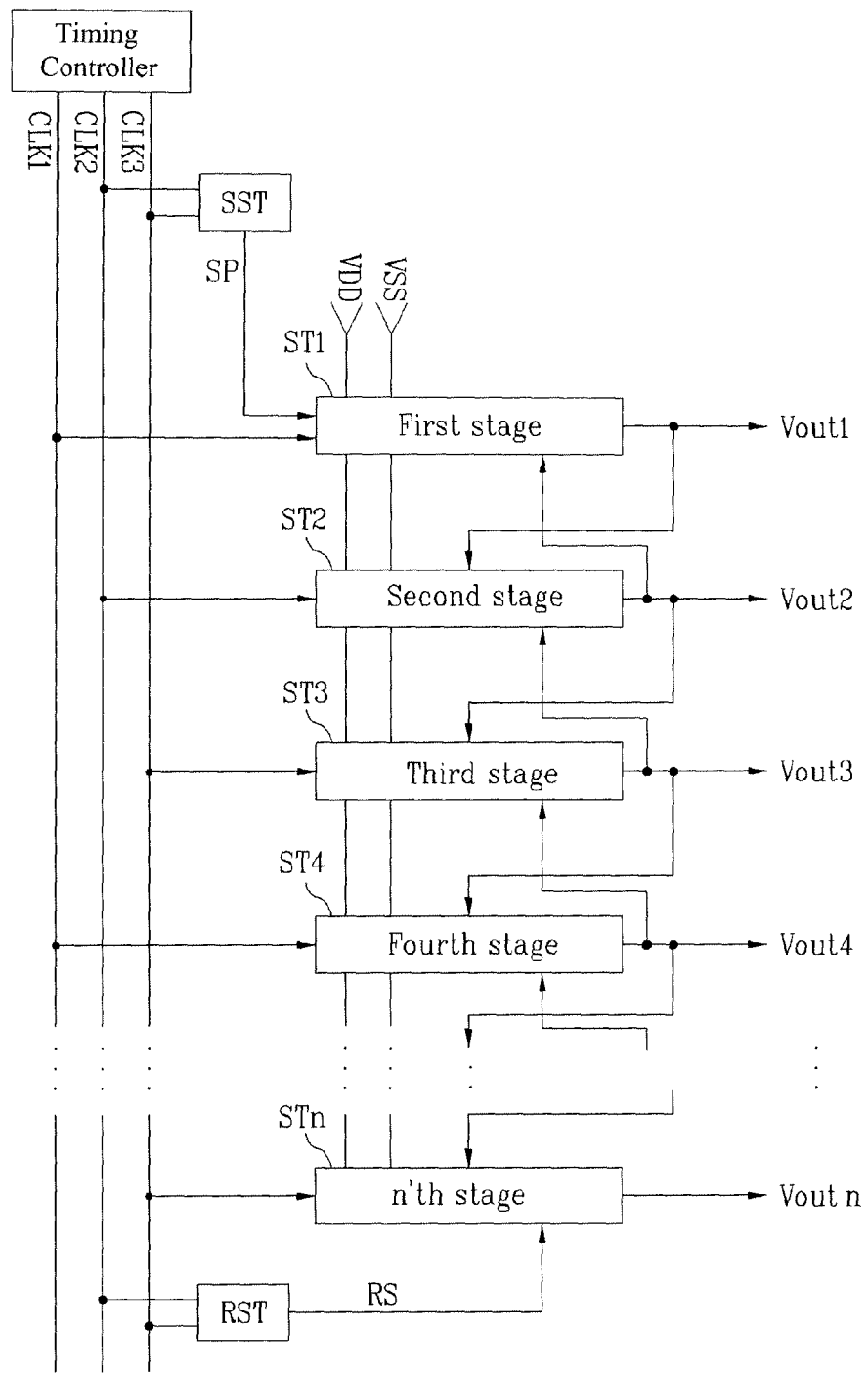
FIG. 2 is a schematic view of illustrating a shift register included in a gate driver of FIG. 1.

FIG. 2 is a schematic view of illustrating the shift register included in the gate driver of FIG. 1.

As shown in FIG. 2, the shift register is comprised of a start pulse generator (SST) to generate a start pulse (SP); a reset signal generator (RST) to generate a reset signal (RS); and 'n' stages (ST1 to STn) cascaded with one another. The 'n' stages (ST1 to STn) output the scan pulses (Vout1 to Voutn) in sequence. At this time, the scan pulses (Vout1 to Voutn) outputted from the respective 'n' stages (ST1 to STn) are sequentially supplied to the gate lines of the LCD panel 20 so that the gate lines are scanned in sequence. For this, the 'n' stages (ST1 to STn) are supplied with first and second driving voltages (VDD, VSS) in common. In this case, the first driving voltage (VDD) corresponds to a gate-on voltage (VGON), and the second driving voltage (VSS) corresponds to a gate-off voltage (VGOFF).

The first stage (ST1) is supplied with the start pulse (SP) outputted from the start pulse generator (SST), and the second to 'n'th stages (ST2 to STn) are supplied with the output signals of preceding stages in sequence, wherein the output signals of preceding stages function as trigger signals. Then, the 'n'th stage (STn) is supplied with the reset signal (RS) outputted from the reset signal generator (RST). The first to 'n-1'th stages (ST1 to STn-1) are supplied with the output signals of next stages, wherein the output signals of next stages function as reset signals.

The start pulse generator (SST) and the reset signal generator (RST) are supplied with at least two of first to third clock pulses (CLK1 to CLK3) through clock supplying lines. Then, the start pulse generator (SST) and the reset signal generator (RST) generate output signals on the basis of the clock pulses supplied thereto. For example, if high voltages of the second and third clock pulses (CLK2, CLK3) are supplied to the start pulse generator (SST) at the same time, the start pulse generator (SST) generates the start pulse (SP), and supplies the generated start pulse (SP) to the first stage (ST1). If high voltages of the second and third clock pulses (CLK2, CLK3) are supplied to the reset signal generator (SST) at the same time, the reset signal generator (RST) generates the reset signal (RS), and supplies the generated reset signal (RS) to the 'n'th stage (STn).

To supply the high voltages of the second and third clock pulses (CLK2, CLK3) at the same time, a timing controller (not shown) additionally provides a dummy clock corresponding to a start control signal through a clock line providing the second clock pulse (CLK2). The detailed explanation for the start control signal will be followed.

Figure 3A:
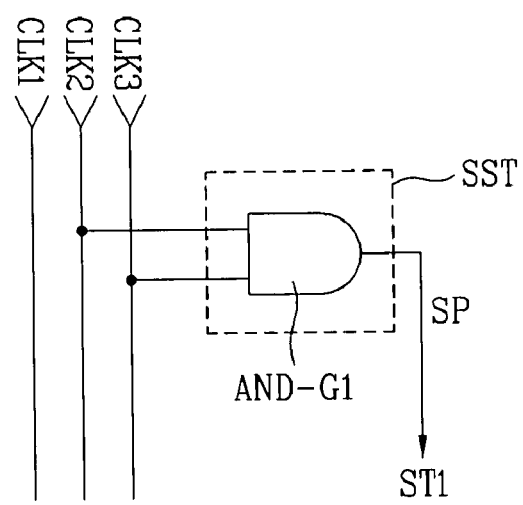
FIGS. 3A and 3B are schematic views of illustrating a start pulse generator on a three-phase driving mode.
Figure 3B:
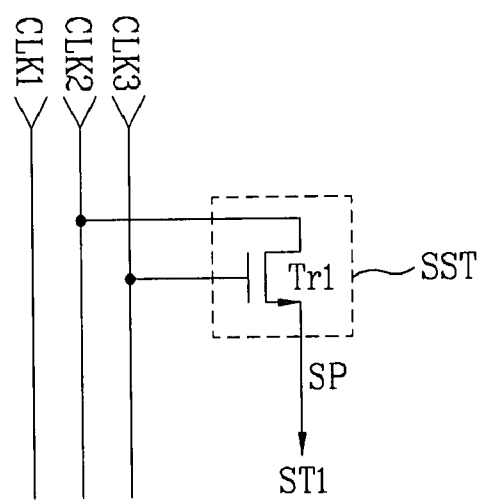
Figure 4:
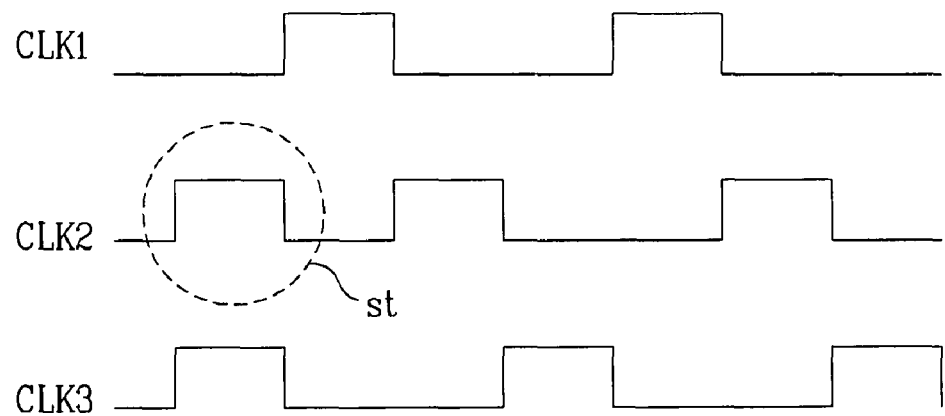
FIG. 4 is a waveform view of illustrating clock pulses supplied to start and reset signal generators.

FIGS. 3A and 3B are schematic views of illustrating the start pulse generator on a three-phase driving mode. FIG. 4 is a waveform view of illustrating the clock pulses supplied to the start and reset signal generators.

The start pulse generator (SST) of FIG. 3A is comprised of a first AND gate (AND-G1).

As shown in FIG. 4, if a start control pulse (st), that is, the second clock pulse (CLK2) synchronized with the third clock pulse (CLK3) is inputted to the start pulse generator (SST) at a time to be output the start pulse (SP), the start pulse (SP) occurs. Then, the start pulse (SP) is supplied to the first stage (ST1). The time of applying the start pulse (SP) corresponds to the start timing of one frame.

FIG. 3B illustrates another structure of the start pulse generator. Referring to FIG. 3B, the start pulse generator (SST) is comprised of a first transistor (Tr1). The first transistor (Tr1) outputs the second clock pulse (CLK2), the start pulse (SP), responding to the third clock pulse (CLK3). The first transistor (Tr1) is formed of an NMOS or a PMOS transistor.

As shown in FIG. 4, if a start control pulse (st), that is, the second clock pulse (CLK2) synchronized with the third clock pulse (CLK3) is inputted to the start pulse generator (SST) at a time to be output the start pulse (SP), the first transistor (Tr1) is turned-on, whereby the start pulse (SP) occurs. Then, the start pulse (SP) is supplied to the first stage (ST1).

Although not shown, a timing controller outputs the start control pulse (st), that is, a dummy clock at the start timing every frame. In detail, the timing controller outputs the start control pulse (st) through the clock line of the second clock pulse (CLK2) at the time to be output the start pulse (SP) to thereby control the start timing every frame. Accordingly, without forming the additional start pulse transmission line, the shift register is driven by the start pulse generated from the start pulse generator (SST).

Figure 5A:
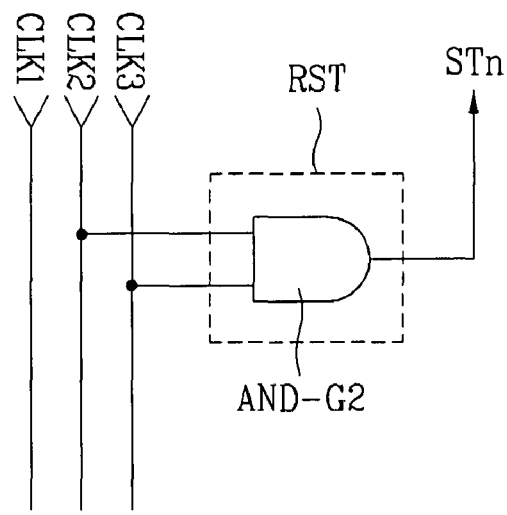
FIGS. 5A and 5B are schematic views of illustrating a reset signal generator on a three-phase driving mode.

FIG. 5A illustrates the reset signal generator on the three-phase driving mode. In FIG. 5A, the reset signal generator (RST) is comprised of a second AND gate (AND-G2). According as the start control pulse (st) shown in FIG. 4, that is, the second clock pulse (CLK2) synchronized with the third clock pulse (CLK3) is supplied to the reset signal generator (RST), the reset signal generator (RST) generates the reset signal (RS). Then, the generated reset signal (RS) is supplied to the 'n'th stage (STn).

At this time, the reset signal (RS) resets the 'n'th stage (STn) corresponding to the last stage at the end point of time every frame. Thus, the reset signal (RS) is generated in synchronization with the start pulse (SP). That is, the start pulse (SP) precedes the time of generating the first scan pulse (Vout1) in the first stage (ST1) by one clock pulse. Accordingly, the 'n'th stage (STn) is reset prior to the time of generating the first scan pulse (Vout1) in the first stage (ST1) by the one clock pulse. The first stage outputs the first scan pulse (Vout1) selecting the first clock pulse (CLK1) responding to the start pulse (SP).

The timing of supplying the reset signal (RS) to the 'n'th stage (STn) corresponds to the start timing for each frame. As a result, the 'n'th stage (STn) operates till a blank period between every frame data without being reset. For example, it is possible not to supply the reset signal (RS) generated in the blank period to the 'n'th stage (STn), and to supply the reset signal (RS) at the end of blank period, that is, the start timing of next frame. During the blank period, the remaining video data may be displayed in the pixel region connected to the 'n'th gate line responding to the 'n'th scan pulse (Voutn) from the 'n'th stage (STn).

Figure 9:
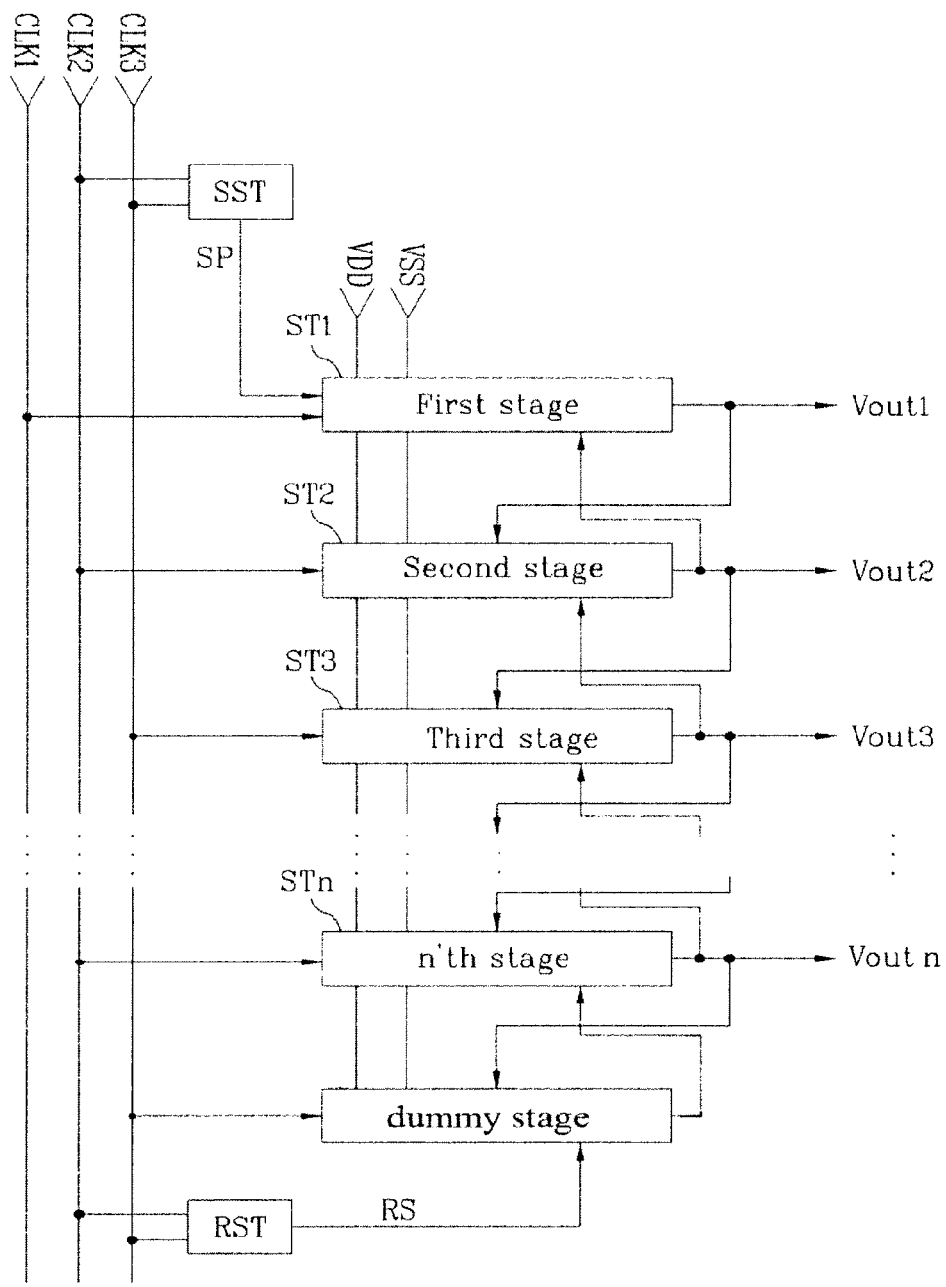
FIG. 9 is a schematic view of illustrating another shift register included in a gate driver of FIG. 1.

In order to solve this problem, as shown in FIG. 9, the shift register according to the present invention may include a dummy stage which uses the scan pulse as the reset signal for the 'n'th stage (STn) without being connected to the gate line. Accordingly, if forming the dummy stage as shown in FIG. 9, the reset signal (RS) outputted from the reset signal generator (RST) is supplied to the dummy stage, whereby the dummy stage is reset responding to the reset signal (RS).

Figure 5B:
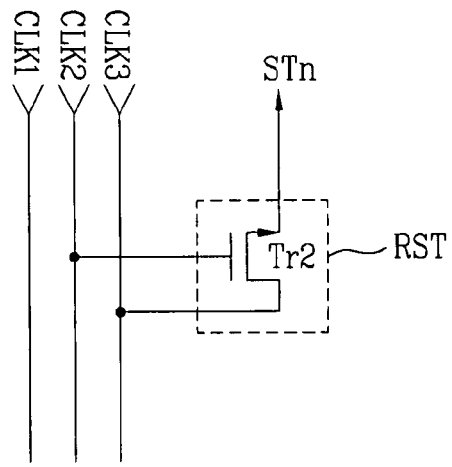

FIG. 5B illustrates another structure of the reset signal generator on the three-phase driving mode. The reset signal generator of FIG. 5B is comprised of a second transistor (Tr2). The second transistor (Tr2) outputs the second clock pulse (CLK2), the reset signal (RS), responding to the third clock pulse (CLK3). According as the start control pulse (st) shown in FIG. 4, that is, the second clock pulse (CLK2) synchronized with the third clock pulse (CLK3) is supplied to the reset signal generator (RST), the second transistor (Tr2) is turned-on, thereby generating the reset signal (RS). Then, the reset signal (RS) is supplied to the 'n'th stage (STn). Without supplying the reset signal through the additional start pulse line, the last stage of the shift register is reset by the reset signal (RS) generated from the reset signal generator (RST).

Figure 6A:
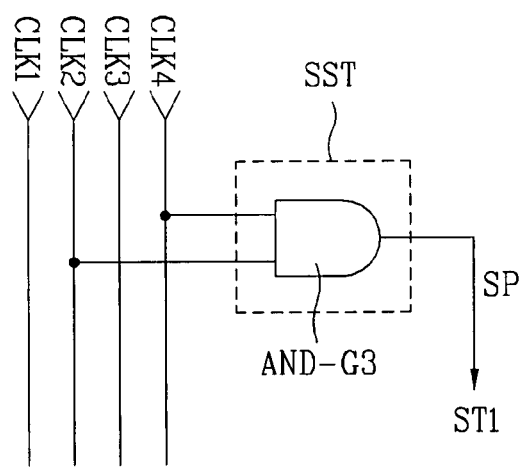
FIGS. 6A and 6B are schematic views of illustrating a start pulse generator on a four-phase driving mode.
Figure 7:
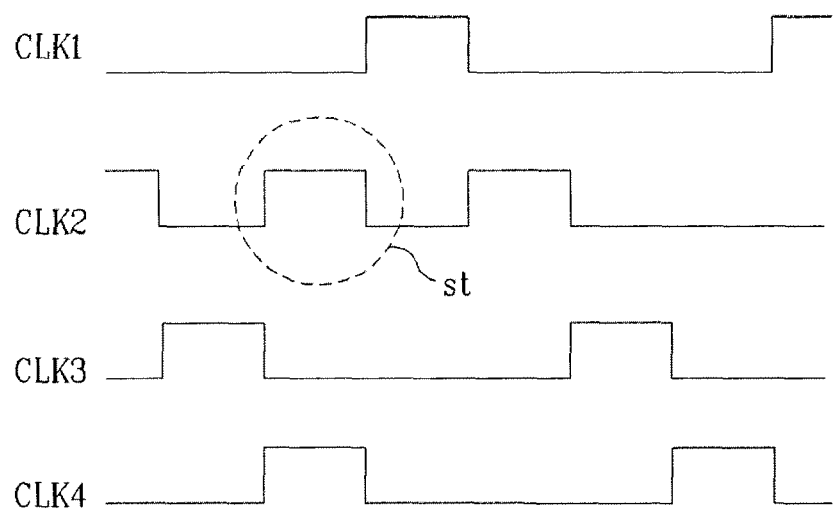
FIG. 7 is a waveform view of illustrating clock pulses supplied to start and reset signal generators.

FIG. 6A is a schematic view of illustrating a start pulse generator on a four-phase driving mode. FIG. 7 is a waveform view of illustrating clock pulses supplied to start and reset signal generators.

The start pulse generator (SST) of FIG. 6A is comprised of a third AND gate (AND-G3).

As shown in FIG. 7, if a start control pulse (st), that is, the second clock pulse (CLK2) synchronized with the fourth clock pulse (CLK4) is inputted to the start pulse generator (SST) at a time to be output the start pulse (SP), the start pulse (SP) occurs. Then, the start pulse (SP) is supplied to the first stage (ST1).

In detail, a timing controller outputs the start control pulse (st) adding to the second clock pulse (CLK2) at the time to be output the start pulse (SP), that is, the start timing for each frame. Accordingly, without forming the additional start pulse line, the shift register is driven by the start pulse (SP) generated from the start pulse generator (SST).

Figure 6B:
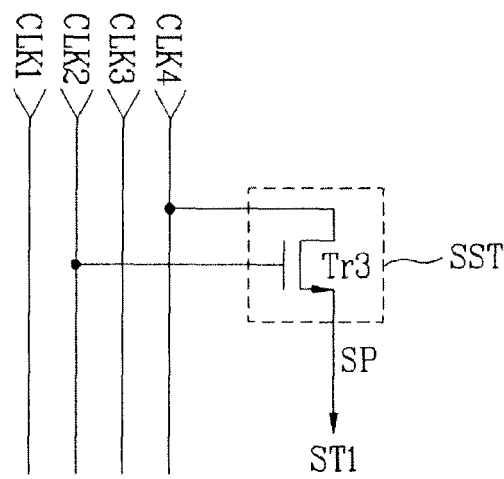

FIG. 6B illustrates another structure of the start pulse generator. The start pulse generator (SST) of FIG. 6B is comprised of a third transistor (Tr3). The third transistor (Tr3) outputs the second clock pulse (CLK2), the start pulse (SP), responding to the fourth clock pulse (CLK4).

Referring to FIG. 7, if a start control pulse (st), that is, the second clock pulse (CLK2) synchronized with the fourth clock pulse (CLK4) is inputted to the start pulse generator (SST) through the clock line of the second clock pulse (CLK2), the start pulse generator (SST) generates the start pulse (SP). Then, the start pulse (SP) is supplied to the first stage (ST1).

Figure 8A:
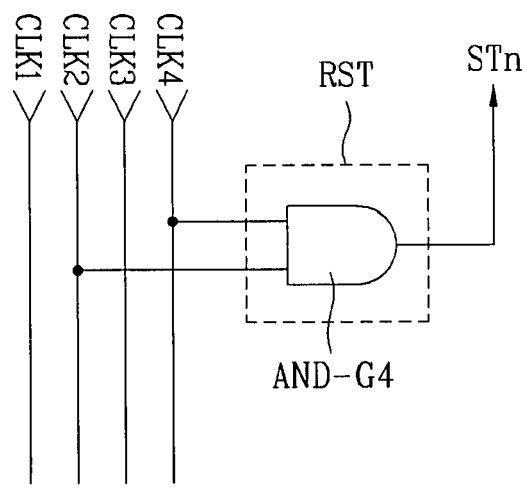
FIGS. 8A and 8B are schematic views of illustrating a reset signal generator on a four-phase driving mode.

FIG. 8A is a schematic view of illustrating the reset signal generator on the four-phase driving mode. The reset signal generator (RST) of FIG. 8A is comprised of a fourth AND gate (AND-G4). According as a start control pulse (st) of FIG. 7, that is, the second clock pulse (CLK2) synchronized with the fourth clock pulse (CLK4) is supplied to the reset signal generator (RST), the reset signal generator (RST) generates the reset signal (RS). Then, the reset signal (RS) is supplied to the 'n'th stage (STn).

The reset signal (RS) resets the 'n'th stage (STn) corresponding to the last stage at the end point of time every frame. Thus, the reset signal (RS) is generated in synchronization with the start pulse (SP). That is, the start pulse (SP) precedes the point in time of generating the first scan pulse (Vout1) in the first stage (ST1) by one clock. Accordingly, the 'n'th stage (STn) is reset prior to the point in time of generating the first scan pulse (Vout1) in the first stage (ST1) by one clock.

Figure 8B:
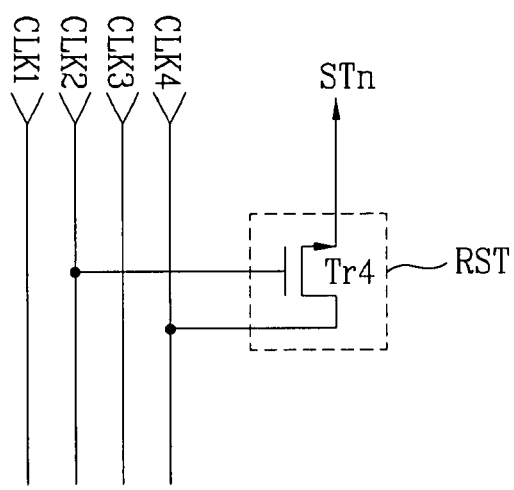

FIG. 8B illustrates another structure of the reset signal generator. The reset signal generator (RST) of FIG. 8B is comprised of a fourth transistor (Tr4).

According as the start control pulse (st) shown in FIG. 7, that is, the second clock pulse (CLK2) synchronized with the fourth clock pulse (CLK4) is supplied to the reset signal generator (RST), the fourth transistor (Tr4) is turned-on, thereby generating the reset signal (RS). Then, the reset signal (RS) is supplied to the 'n'th stage (STn). Accordingly, without forming the additional start pulse line, the shift register is driven by the dummy signal (RS) generated from the reset signal generator (RST).

The shift register according to the present invention includes the start and reset signal generators (SST, RST) to generate the start and reset signals (SP, RS). There is no need to provide the start pulse transmission line from the timing controller.

Accordingly, it is possible to decrease the number of input and output channels used for a level shifter, wherein the level shifter shift the level of the plurality of clock pulses including the start control pulse from the timing controller, and then outputs the level-shifted clock pulses to the shift register. That is, in the level shifter, a input and output channels providing the start pulse are omitted.

For the shift register according to the present invention, it is unnecessary to provide at least one dummy stage to reset the last stage. Thus, the shift register of the present invention occupies the small space of the TFT array substrate. According as the start and reset signal transmission lines are decreased in number, the size of shift register is decreased more.

As mentioned above, the shift register of the LCD device according to the present invention and the driving method thereof has the following advantages.

According as the start pulse and the reset signal generate by the clock pulses supplied to the shift register, it is possible to remove the dummy stage from the shift register with the decreased number of signal transmission lines. Accordingly, the number of channels used in the level shifter is decreases, and the shift register occupies the small space of the TFT array substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus of driving an LCD device comprising:
    a display panel to display images;
    a gate driver to drive gate lines of the display panel, wherein the gate driver includes a shift register comprised of a plurality of stages cascaded with one another;
    a timing controller to control the gate driver by generating clock pulses, having the different phases from one another, and a start control pulse, wherein the start control pulse is added to a second clock pulse among the clock pulses and is synchronized with a third or fourth clock pulse among the clock pulses; and
    a start pulse generator to generate a start pulse using the start control pulse and the clock pulse synchronized with the start control pulse, and to supply the generated start pulse to a first stage of the gate driver, wherein the start pulse generator is formed in the gate driver; and
    a reset signal generator to generate a reset signal using the start control pulse and the clock pulse synchronized with the start control pulse, wherein reset signal generator is formed in the gate driver,
    wherein the gate driver further comprises at least one dummy stage cascaded with the final stage of the shift register, wherein the reset signal is supplied to the dummy stage.

2. The apparatus of claim 1, wherein the start control pulse is generated at a starting time so as to control the start timing of the gate driver.

3. The apparatus of claim 1, wherein the start pulse generator is formed of at least one AND gate.

4. The apparatus of claim 1, wherein the start pulse generator is formed of at least one NMOS or PMOS transistor.

5. The apparatus of claim 1, wherein the start control pulse is synchronized with the start pulse.

6. The apparatus of claim 1, wherein the reset signal generator is formed of at least one AND gate.

7. The apparatus of claim 1, wherein the reset signal generator is formed of at least one NMOS or PMOS transistor.

* * * * *